Oct. 18, 1966 G. D. CODY ETAL 3,279,954

THERMOELECTRIC DEVICE HAVING SILICON-GERMANIUM ALLOY THERMOELEMENT

Filed Oct. 11, 1962

2 Sheets-Sheet 1

INVENTORS
GEORGE D. CODY &
BY BENJAMIN ABELES

W.S. Hill
AGENT

INVENTORS
GEORGE D. CODY &
BY BENJAMIN ABELES
W.S. Hill
AGENT 3,279,954
Patented Oct. 18, 1966

3,279,954

THERMOELECTRIC DEVICE HAVING SILICON-GERMANIUM ALLOY THERMOELEMENT

George D. Cody, Hopewell, and Benjamin Abeles, Princeton, N.J., assignors to Radio Corporation of America, a corporation of Delaware Filed Oct. 11, 1962, Ser. No. 229,830
5 Claims. (Cl. 136—205)

This application is a continuation-in-part of our copending application Serial No. 116,169, filed June 9, 1961, now abandoned.

This invention relates to improved thermoelectric compositions and improved thermoelectric devices made of made of these materials.

When two rods or wires of dissimilar thermoelectric compositions have their ends joined to form a continuous loop, two thermoelectric junctions are established respectively between the ends so joined. If the two junctions are maintained at different temperatures, an electromotive force will be set up in the circuit thus formed. This effect is called the thermoelectric or Seebeck effect, and may be regarded as due to the change carrier concentration gradient produced by a temperature gradient in the two materials. The effect should not be ascribed to either material alone, since two dissimilar (thermoelectrically complementary) materials are necessary to obtain this effect. It is therefore customary to measure the Seebeck effect produced by a particular material by forming a thermocouple in which one circuit member consists of one such material, and the other circuit member consists of a metal such as copper or lead, which has negligible thermoelectric power. The thermoelectric power (Q) of a material is the open circuit voltage developed by such a thermocouple when the two junctions are maintained at a temperature difference of 1° C.

The Seebeck effect is utilized in many practical applications, such as the thermocouple thermometer. The Seebeck effect is also important for the transformation of heat energy directly into electrical energy.

When thermal energy is converted to electrical energy by means of thermocouple devices utilizing the Seebeck effect, each device may be regarded as a heat engine operating between a heat source at a high or relatively hot temperature $T_H$ and a heat sink at a low or relatively cold temperature $T_C$. The limiting or maximum efficiency theoretically attainable from any heat engine is the Carnot efficiency, which is $$\frac{T_H - T_C}{T_H}$$

It is thus seen that the efficiency of Seebeck effect devices is increased by increasing the temperature difference $\Delta T$ between the hot junction temperature $T_H$ and the cold junction temperature $T_C$. Since it is convenient to operate such Seebeck devices with the cold junction at room temperature, it follows that high efficiency in the conversion of thermal energy to electrical energy requires that the hot junction temperature $T_H$ be as high as possible.

The efficiency of Seebeck effect devices is also related to a material Figure of Merit Z, where Z is given by the square of the thermoelectric power Q divided by the product of the thermal conductivity K and the electrical resistivity $p$ for the material. For very large values of Z, the efficiency of a Seebeck effect device approaches the Carnot efficiency. For low values of Z, the efficiency ($\eta$) of the device is given approximately by $$\eta \approx \tfrac{1}{4} Z (T_H - T_C)$$

Some thermoelectric compositions, such as bismuth telluride, which are useful at relatively low temperatures cannot be operated at elevated temperatures because their properties tend to break down, or they react with the environment when heated to high temperatures. It is therefore necessary for high efficiency, high temperature Seebeck devices to utilize only those thermoelectric compositions which are stable at elevated temperatures.

An object of this invention is to provide improved thermoelectric compositions having improved thermoelectric properties for application to power generation.

Another object is to provide improved thermoelectric compositions and alloys which may be readily and easily prepared to have high Figures of Merit.

Still another object of this invention is to provide improved thermoelectric devices capable of efficient operation for the direct conversion of heat into electrical energy.

But another object is to provide improved thermoelectric compositions capable of operating at temperatures up to about 1200° K., and improved thermoelectric devices made of these compositions.

These and other objects of the invention are accomplished by providing an improved thermoelectric device in which at least one of the two thermoelectrically complementary circuit members is composed of improved thermoelectric alloys having certain thermoelectric properties significantly better than those of previously known materials. The thermoelectric alloys consist essentially of silicon-germanium alloys having a composition within the critical range of about 50 to 95 atomic percent silicon, balance germanium, and also having a charge carrier concentration within the critical range of from about $4 \times 10^{19}$ per cm.$^3$ to saturation, which may be about $4 \times 10^{20}$ charge carriers per cm.$^3$.

The invention will be described in greater detail by reference to the accompanying drawing, in which.

Figure 2:
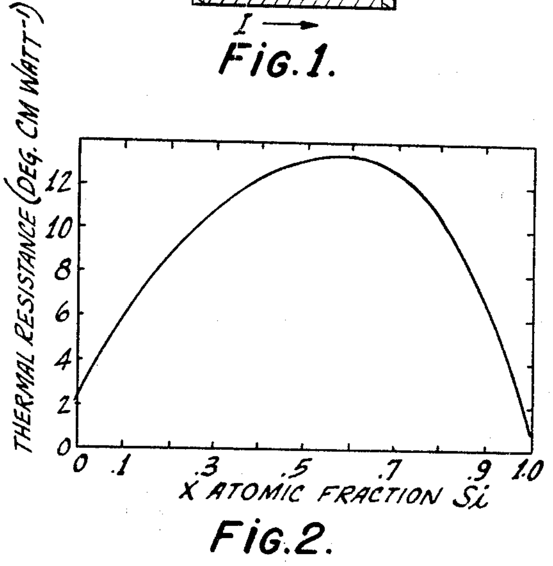
FIG. 2 is a plot showing the variation of thermal resistivity at room temperature for silicon-germanium alloys of varying silicon content.
Figures 6, 7:
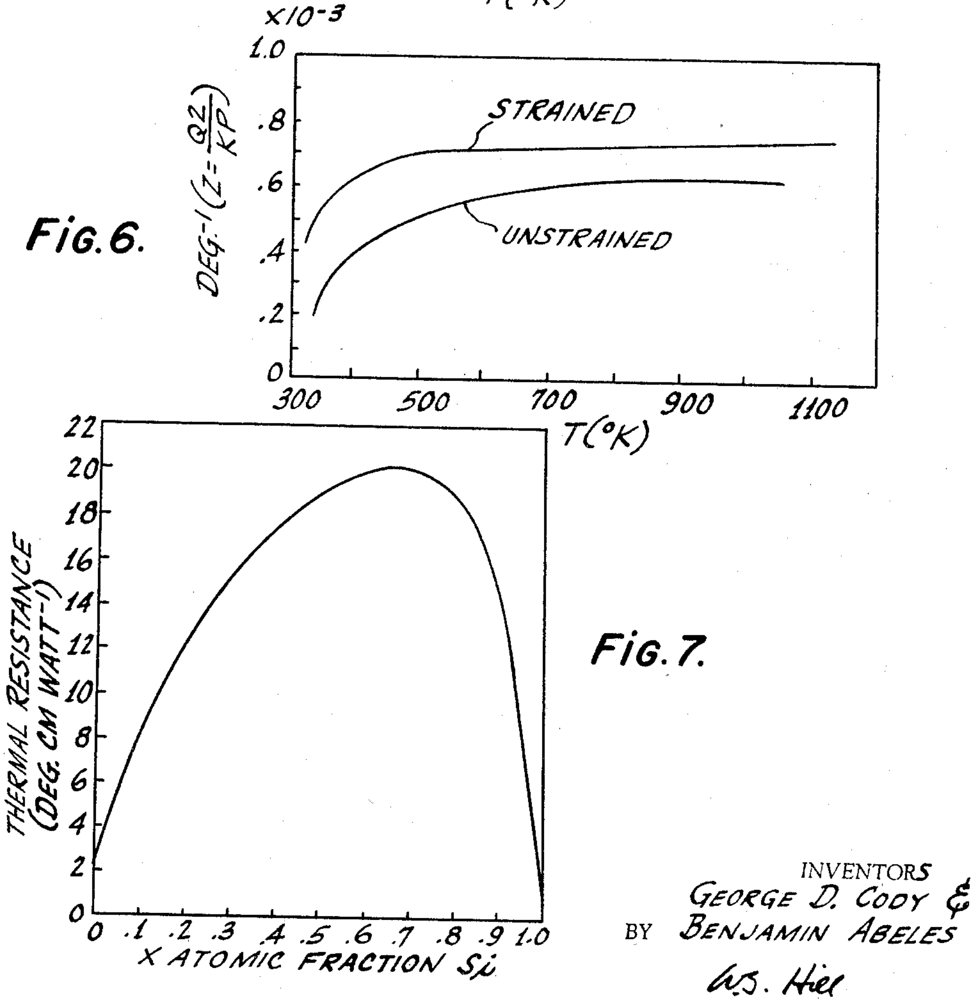

FIG. 6 is a graph showing the variation of the Figure of Merit Z with temperature for a strained and an unstrained silicon-germanium alloy of the invention; and FIG. 7 is a graph on the same scale as FIG. 2 showing the variation of thermal resistivity at room temperature for heavily doped silicon-germanium alloys of varying silicon content, said alloys having an electrical resistivity of less than 0.005 ohm-cm.

Since good thermoelectric materials are near-degenerate semiconductors, they may be classed as N-type or P-type, depending on whether the majority carriers in the material are electrons or holes, respectively. The conductivity type of thermoelectric materials may be controlled by adding appropriate acceptor or donor impurity substances. Whether a particular material is N-type or P-type may be determined by noting the direction of current flow in a thermoelectric device formed by a thermoelectric circuit member or thermoelement of the particular thermoelectric material and another thermoelement of complementary material when operated as a thermoelectric generator according to the Seebeck effect. The direction of the positive (conventional) current in the cold junction will be from the P-type toward the N-type thermoelectric material. The compositions according to this invention are of both P-type and N-type conductivity.

There are three fundamental requirements for desirable thermoelectric materials. The first requirement is the development of a high electromotive force per degree difference in temperature between junctions in a circuit containing two thermoelectric junctions. This quality is referred to as the thermoelectric power (Q) of the material, and may be defined as $d\theta/dT$, where $d\theta$ is the potential difference induced by a temperature difference $dT$ between two ends of an element made of the material. The thermoelectric power of a material may also be considered as the energy relative to the Fermi level transmitted by a charge carrier along the material per degree temperature difference. The second requirement for a good thermoelectric material is high electrical conductivity ($\sigma$), or, conversely stated, low electrical resistivity ($p$). The third requirement is a low thermal conductivity, since it would be difficult to maintain either high or low temperatures at a thermoelectric junction if one or both of the thermoelectric materials conducted heat too readily. High thermal conductivity K in a thermoelectric material would reduce the efficiency of the resulting Seebeck device. An important feature of the instant invention is the unexpectedly low thermal conductivity over a wide temperature range obtained in thermoelectric alloys having the critical composition range and charge concentration range recited above.

A quantitative approximation of the quality of a thermoelectric material may be made by relating the above three factors Q, K and $p$ in a Figure of Merit Z, which is usually defined as $$Z=\frac{Q^2}{pK}$$

if the properties of the two branches of the thermocouples are the same. Here Q is the thermoelectric power, $p$ is the electrical resistivity, and K is the total thermal conductivity. Alternatively, the Figure of Merit Z may be expressed as $Q^2\omega/p$, where $\omega$ is the thermal resistivity or reciprocal of K, and $p$ and Q have the same meaning as above.

The validity of $Q^2/pK$ as a Figure of Merit for the indication of the usefulness of thermoelectric materials for practical applications is well established. Thus, as an objective, high thermoelectric power, high electrical conductivity and low thermal conductivity are desired. These objectives are difficult to attain because materials which are good conductors of electricity are usually good conductors of heat, and the thermoelectric power and electrical resistivity of a material are not independent of each other. Accordingly, to satisfy this objective, one seeks a material with maximum ratio of electrical to thermal conductivities and a high thermoelectric power.

Figure 1:
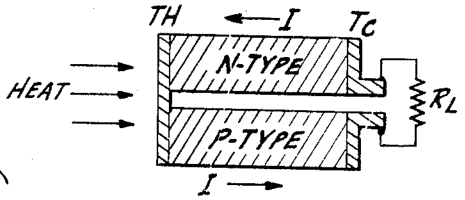
FIG. 1 is a schematic cross-sectional view of a thermoelectric device according to the invention for the direct transformation of heat energy into electrical energy by means of the Seebeck effect.

A thermoelectric device embodying the invention and affording the efficient conversion of thermal energy directly into electrical energy by means of the Seebeck effect is illustrated in FIGURE 1. The device 10 comprises the two different thermoelectric circuit members of thermoelements 11 and 12, which are conductively joined at one end, hereinafter denoted the hot junction end, by means of an intermediate member 13. The intermediate member 13 may be in the form of a buss bar or a plate, and is made of a material which is thermally and electrically conductive, and has negligible thermoelectric power. Metals and high electrical conductivity alloys are suitable materials for this purpose. In this example, intermediate member 13 consists of a tungsten plate. The thermoelectrically active circuit members or thermoelements 11 and 12 terminate at the end opposite the hot thermoelectric junction in electrical contacts 14 and 15, respectively. In this example, contacts 14 and 15 are copper plates.

Figure 3:
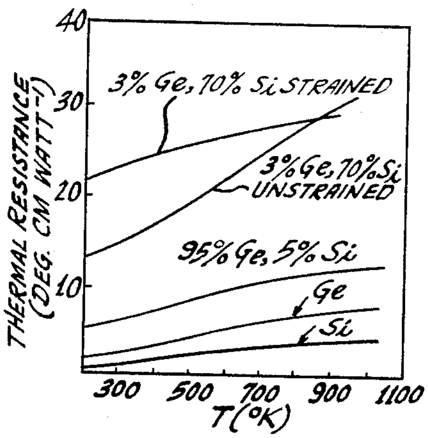
FIG. 3 is a graph showing the variation of thermal resistivity with temperature for pure germanium, pure silicon, and some silicon-germanium alloys.

The significance of the silicon-germanium alloys according to the invention as materials for Seebeck effect power generating devices can best be seen in FIGS. 2, 3 and 7. In FIG. 2 are shown the measured thermal resistivities at room temperature (300° K.) for undoped silicon-germanium alloys of varying silicon content. In FIG. 7 the measured thermal resistivity at room temperature for heavily-doped silicon-germanium alloys, that is, alloys having an electrical resistivity of less than 0.005 ohm-cm., is shown for alloys of varying silicon content. In FIG. 3 the variation of the thermal resistance with temperature for some of the alloys of FIG. 2 is plotted. Not only do the silicon-germanium alloys have a larger room temperature value of thermal resistance than the pure elements, but also the temperature coefficients of thermal resistance for the alloys are larger than those of the pure elements. This temperature dependence can be derived on the basis of a theory which considers the combined effects of phonon-phonon scattering and phonon impurity scattering. This theory predicts enhancement of the thermal resistance of a strained specimen at room temperature. As can be seen from FIG. 3, this effect is also observed. Strain was inserted in this specimen due to extensive inhomogeneity in alloying composition. On the basis of FIGS. 2, 3 and 7 one sees that, due to their high thermal resistance, alloys of silicon and germanium in the composition range of about 50 atomic percent silicon to 95 atomic percent silicon have great utility as thermoelectric power generating materials.

In the higher ranges of silicon content, the thermal resistance of the silicon-germanium alloys starts to decrease, which results in a decrease in the Figure of Merit Z. However, the higher the silicon content of the alloy, the greater the solubility of the P-type and N-type doping agents in these alloys, and hence there is less tendency for the doping agent to precipitate. Moreover, the larger carrier concentration results in an increase in phonon scattering by the free carriers, and hence partially compensates the decrease in thermal resistance due to the increased silicon content. The increase of thermal resistance with doping can be seen by comparing the curve in FIG. 7 for the thermal resistance of heavily-doped silicon-germanium alloys of varying silicon content with the similar curve in FIG. 2 for the thermal resistance of undoped silicon-germanium alloys of varying silicon content. Furthermore, the higher the silicon content, the higher the bandgap and the higher the melting point of the alloy, which is desirable for operation at elevated temperatures.

*Example I*

As indicated above, it has been found that improved efficiency in the direct conversion of thermal energy into electrical energy is attained in Seebeck thermocouple devices of the type shown in FIGURE 1 by preparing at least one of the two circuit members of thermoelements 11 and 12 from a thermoelectric silicon-germanium alloy composed of 50 to 95 atomic percent silicon, and containing upwards of $4\times10^{19}$ charge carriers per cm.$^3$. The charge carriers may be electrons obtained by the incorporation within the alloys of donor atoms such as atoms of phosphorus, arsenic, and antimony, or combinations of these. Alternatively, the charge carrier in the aforesaid alloys may be holes obtained by the incorporation within the alloys of acceptor atoms, such as atoms of boron, aluminum, gallium and indium, or combinations of these. In this example, circuit member 11 is made of an N-type thermoelectric alloy consisting essentially of 70 atomic percent silicon–30 atomic percent germanium, said alloy including sufficient arsenic atoms to have a charge carrier (electrons) concentration of about $5\times10^{19}$ per cm.$^3$.

Since thermoelement or circuit member 11 is thus made of N-type material, the other circuit member 12 is made of thermoelectrically complementary material, that is, of P-type thermoelectric material. Examples of suitable P-type materials for this purpose are lead telluride and silver antimony telluride. Other suitable P-type thermoelectric alloys are described in Examples III and IV below.

In the operation of the device 10, the metal plate 13 is heated to a temperature $T_H$ and becomes the hot junction of the device. The metal contacts 14 and 15 on each thermoelement are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15, respectively. The electromotive force developed under these conditions produces in the external circuit a flow of (conventional) current (I) in the direction shown by arrows in FIGURE 1, that is, from the P-type thermoelement 12 toward the N-type thermoelement 11 in the cold junction. The device is utilized by connecting a load, shown as a resistance 16 in the drawing, between the contacts 14 and 15 of the thermoelements 11 and 12, respectively.

A series of thermoelectric compositions according to the invention are easily prepared by melting together the proper ratios of germanium and silicon, along with the particular doping agent desired. The materials may be melted together in a fused quartz ampule. The germanium and silicon may be in powdered or granulated form, and are heated together to a temperature of about 1400° C. for the particular alloy of this example. The melt is permitted to cool. The resulting ingot may be zone-levelled by passing a molten zone along the ingot for purposes of chemical homogeneity. The tube or ampule is next removed from the furnace, and then opened to obtain the solidified ingot. Alternatively, a crystalline silicon-germanium alloy may be pulled from a melt by a Czochralski technique.

The composition of this example may be prepared by the process described above by melting together in an ampule 65.34 grams granulated germanium, 58.99 grams granulated silicon, 30 atomic percent germanium and 70 atomic percent silicon, and .2335 gram granulated arsenic for a charge carrier concentration of about $5\times10^{19}$ per cm.$^3$. The room temperature thermoelectric power (Q) of this composition is about 180 microvolts per degree C.; the electrical resistivity ($p$) is $1.7\times10^{-3}$ ohm-cm.; and the thermal conductivity (K) is .053 watt per cm. per degree C. The Figure of Merit Z for this composition, that is the value of $(Q^2/pK)$ is about $.36\times10^{-3}$ deg.$^{-1}$, at room temperature.

Figure 4:
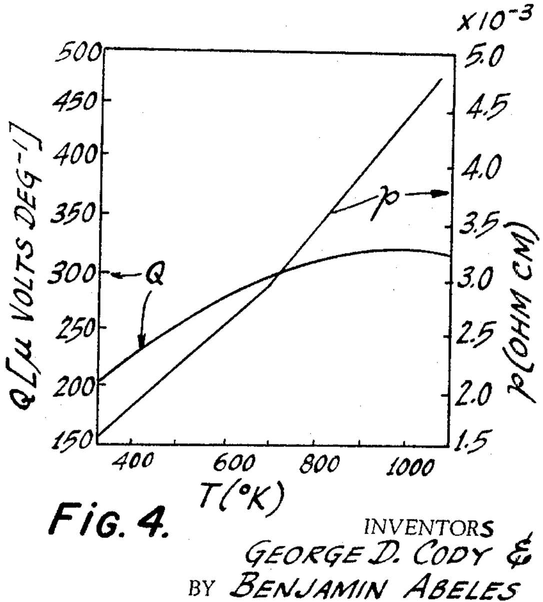
FIG. 4 is a graph showing the variation of thermoelectric power Q with temperature, and the variation of resistivity $p$ with temperature for a thermoelectric silicon-germanium alloy of the invention.
Figure 5:
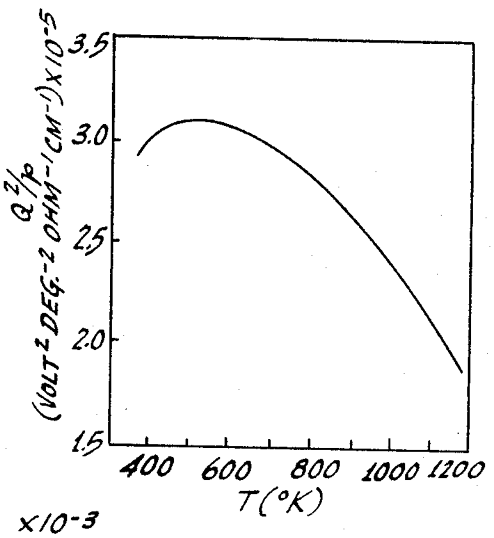
FIG. 5 is a graph showing the variation of the quotient of the square of thermoelectric power $Q^2$ over resistivity $p$ for another thermoelectric silicon-germanium alloy of the invention.

FIG. 4 shows the temperature variation of resistivity and thermoelectric power for the particular alloy of this example. Similar behavior is obtained for other alloys in the same concentration and doping range. FIG. 5 shows a plot of the quotient $Q^2/p$ for the same alloys as a function of temperature. FIG. 6 shows the temperature variation of the Figure of Merit Z for a strained and unstrained alloy specimen. The effect of strain is to raise the Figure of Merit at room temperature, but the effect is small at elevated temperatures.

*Example II*

In this example, the circuit member of thermoelement 11 is made of an N-type thermoelectric composition consisting of 50 atomic percent silicon-50 atomic percent germanium which contains sufficient phosphorus to have a charge carrier concentration of about $5\times10^{19}$ per cm.$^3$. The other circuit member 12 is formed of a P-type thermoelectric material such as lead telluride, silver antimony telluride, or one of the materials described in Examples III and IV below.

The composition of this example may be prepared from the granulated ingredients as described above by melting together 72 grams germanium, 28 grams silicon, and .065 gram phosphorus. The composition of this example was found to exhibit a room temperature thermoelectric power (Q) of 180 microvolts per deg. C.; a resistivity $p$ of $1.7\times10^{-3}$ ohm-cm.; and a total thermal conductivity (K) of .055 watt per cm. per deg. C. The Figure of Merit Z at room temperature for this composition is about $35\times10^{-3}$ deg.$^{-1}$.

*Example III*

In this example, at least one of the two thermoelements or circuit members 11 and 12 of a thermoelectric device which utilizes the Seebeck effect for directly converting thermal energy into electrical energy is prepared from a material consisting of 70 atomic percent silicon–30 atomic percent germanium and containing sufficient boron to have a charge carrier (holes) concentration of about $5\times10^{19}$ per cm.$^3$. The other circuit member should be of thermoelectrically complementary material, that is, should be N-type in this example, and hence may be made of one of the materials described in Examples I and II above.

The composition of this example may be prepared from the granulated ingredients as described above by melting together 35.43 grams silicon, 39.1 grams germanium, and .020 gram boron. The composition of Example III was found to exhibit a room temperature thermoelectric power (Q) of 175 microvolts per deg. C.; a resistivity ($p$) of .00245 ohm-cm.; and a total thermal conductivity (K) of .062 watt per cm. per deg. C. The Figure of Merit Z for this composition is about $.20\times10^{-3}$ deg.$^{-1}$ at room temperature.

*Example IV*

In this example, at least one of the two circuit members or thermoelements 11 and 12 of a thermoelectric device 10 which utilizes the Seebeck effect for directly converting thermal energy into electrical energy is prepared from a P-type thermoelectric alloy consisting of 60 atomic percent silicon–40 percent germanium, and including sufficient boron to have a charge carrier (holes) concentration of about $5\times10^{19}$ per cm.$^3$. The other circuit member should be N-type in this example, and hence may be made of one of the alloys described in Examples I and II above.

The composition of this example may be prepared from the granulated ingredients as described above by melting together 58 grams germanium, 34 grams silicon, and .023 gram boron. The alloy thus formed was found to exhibit a thermoelectric power (Q) of 175 microvolts per deg. C.; a resistivity ($p$) of .00245 ohm-cm.; and a total thermal conductivity (K) of .062 watt per cm. per deg. C. The Figure of Merit Z for this composition is about $.20\times10^{-3}$ deg.$^{-1}$.

It will be understood by those skilled in the art that the maximum concentration of charge carriers in an extrinsic semiconductor, that is, a semiconductor containing one or more doping agents, is limited by the solubility of the particular acceptors or donors utilized as doping agents. The maximum solubility of an acceptor such as boron, gallium, and the like, or of a donor such as arsenic or phosphorus in a semiconductor such as the 50 to 95 atomic percent silicon—50 to 5 atomic percent germanium alloys of the invention varies with the temperature of the semiconductor. Accordingly, although a relatively high concentration of a particular acceptor or donor may be attained at room temperature in a particular silicon-germanium alloy of the invention, for example, by rapidly freezing a heavily doped melt, the subsequent use of the alloy in a thermoelectric device at an elevated temperature for a prolonged period of time may result in annealing of the alloy and precipitation of some of the doping agent, so that the concentration of the doping agent remaining dissolved in the alloy is that corresponding to the maxmium solubility of the particular doping agent in a silicon-germanium alloy of the particular composition utilized at the particular temperature of operation. Conversely, if the solubility of the doping agent in the semiconductor increases at elevated temperatures, some of the doping agent present as an undissolved phase at room temperature may dissolve in the semiconductor when used in a thermoelectric device at an elevated temperature. Charge carrier concentrations of up to about $1.5\times10^{-20}$ at room temperature have been obtained in the N-type silicon-germanium alloys of the invention containing a donor such as arsenic or phosphorus. For obtaining charge carrier concentrations above about $1.5\times10^{-20}$ per cm.$^3$, for example concentrations as high as $4\times10^{20}$ charge carriers per cm.$^3$, boron has been found sufficiently soluble in the P-type silicon-germanium alloys of the invention.

*Example V*

In this example, the P-type circuit member or thermoelement 12 of a thermoelectric device 10 is prepared from an alloy consisting of 70 atomic percent silicon, 30 atomic percent germanium, and including sufficient boron to have a charge carrier (holes) concentration of about $4\times10^{20}$ per cm.$^3$. The other circuit member should be N-type in this example, and hence may be one of the alloys described in Examples I and II above.

The composition of this example may be prepared from the granulated ingredients as described above by melting together 52.5 grams silicon, 47.5 grams germanium and .216 gram boron. The alloy thus formed was found to exhibit a room temperature thermoelectric power (Q) of about 67 microvolts per deg. C.; a resistivity ($p$) of .00038 ohm-cm.; and a total thermal conductivity (K) of .056 watt per cm. per deg. C. The Figure of Merit Z for this composition is about $.26\times10^{-3}$ deg.$^{-1}$ at room temperature.

*Example VI*

In this example, the N-type circuit member or thermoelement 11 of a thermoelectric device 10 for converting thermal energy into electrical energy is prepared from a thermoelectric alloy consisting of 80 atomic percent silicon–20 atomic percent germanium, and including sufficient arsenic to have a charge carrier (electrons) concentration of about $1\times10^{20}$ per cm.$^3$. The composition of this example may be prepared from the granulated ingredients as described above by melting together 60.7 grams silicon, 39.3 grams germanium, and sufficient arsenic (.414 gram of arsenic). This material was found to exhibit at room temperature a thermoelectric power (Q) of about 122 microvolts per deg. C.; a resistivity ($p$) of .00089 ohm-cm.; and a total thermal conductivity (K) of .053 watt per cm. per deg. C. The Figure of Merit Z for this composition is about $.32\times10^{-3}$ deg.$^{-1}$ at room temperature.

The other circuit member or P-type thermoelement 12 in this example is prepared from a thermoelectric alloy consisting of 80 atomic percent silicon–20 atomic percent germanium, and including sufficient boron to have a charge carrier (holes) concentration of about $1.5\times10^{20}$ per cm.$^3$. This composition may be prepared from the granulated ingredients as described above by melting together 60.7 grams silicon, 39.3 grams germanium, and sufficient boron (about .090 gram of boron). The alloy thus formed was found to exhibit a room temperature thermoelectric power (Q) of about 115 microvolts per deg. C.; a resistivity ($p$) of .00097 ohm-cm.; and a total thermal conductivity (K) of .055 watt per cm. per deg. C. The Figure of Merit Z for this composition is about $.25\times10^{-3}$ deg.$^{-1}$ at room temperature.

*Example VII*

In this example, the N-type circuit member or thermoelement 11 of a thermoelectric device 10 for converting thermal energy into electrical energy is prepared from a thermoelectric alloy consisting of 85 atomic percent silicon–15 atomic percent germanium, and includes sufficient arsenic to have a charge carrier (electrons) concentration of about $1\times10^{20}$ per cm.$^3$. The composition of this example may be prepared from the granulated ingredients as described above by melting together 68.7 grams silicon, 31.3 grams germanium, and sufficient arsenic (about .443 gram of arsenic). This material was found to exhibit at room temperature a thermoelectric power (Q) of about 123 microvolts per deg. C.; a resistivity ($p$) of .00095 ohm-cm.; and a total thermal conductivity (K) of .059 watt per cm. per deg. C. The Figure of Merit Z for this composition is about $.27\times10^{-3}$ deg.$^{-1}$ at room temperature.

The other circuit member of P-type thermoelement 12 in this example is prepared from a thermoelectric alloy consisting of 87 atomic percent silicon–13 atomic percent germanium, and including sufficient boron to have a charge carrier (holes) concentration of about $1.5\times10^{20}$ per cm.$^3$. This composition may be prepared from the granulated ingredients as described above by melting together 72.2 grams silicon, 27.8 grams germanium, and sufficient boron (about .096 gram of boron). The alloy thus formed was found to exhibit a room temperature thermoelectric power (Q) of about 120 microvolts per deg. C.; a resistivity ($p$) of .00089 ohm-cm.; and a total thermal conductivity (K) of about .062 watt per cm. per deg. C. The Figure of Merit Z for this composition is about $.26\times10^{-3}$ deg.$^{-1}$ at room temperature.

The power generating efficiency of a thermoelectric Seebeck device may be defined as the ratio of the output of electrical energy to the input of thermal energy. The measured average Z value of silicon-germanium alloys containing about 70 atomic percent silicon and a charge carrier concentration in the range of from $4\times10^{19}$ and upwards per cm.$^3$, and operating between a hot junction temperature of 1200° K. and a cold junction temperature of 300° K. is $6\times10^{-4}$ deg.$^{-1}$. Therefore, a power generating efficiency of about 10 percent can be expected in a thermoelectric device operating over this temperature range in which both the P-type thermoelectric circuit member and the N-type thermoelectric circuit member consist of such alloys. Such a Seebeck thermocouple was constructed, and exhibited a power generating efficiency of 7.5 percent; radiation losses and contact resistances were measured, and account for the 2.5 percent difference from the predicted (10 percent) and measured (7.5 percent) efficiencies.

Thermoelectric devices can also be fabricated with composite thermoelements consisting of two different thermoelectric materials, in which the portion of higher energy gap is utilized adjacent the hot junction, and the material of lower energy gap is utilized adjacent the cold junction. Each material is thus utilized in the temperature range in which it is most efficient. See, for example, figure 3 of Rosi, Dismukes and Hockings, "Semiconductor Materials for Thermoelectric Power Generation up to 700° C." Electrical Engineering, June 1960. For a thermoelectric device utilizing composite thermoelements, in which the portion of each thermoelement adjacent the hot junction (at 1200° K.) consists of the silicon-germanium alloys described above, and the portion of each thermoelement adjacent the cold junction (at 300° K.) consists of known materials, a power generating efficiency in excess of 15 percent may be expected.

What is claimed is:

1. A thermoelectric device comprising two thermoelements, one said thermoelement consisting of P-type thermoelectric material and the other of N-type thermoelectric material, an electrical conductor for conductively joining said thermoelements to form a thermoelectric junction, at least one of said two thermoelements comprising an alloy consisting essentially of silicon and germanium, said alloy containing 50 to 95 atomic percent silicon and having a charge carrier concentration of from at least $4\times10^{19}$ per cm.$^3$ to saturation.

2. A thermoelectric device comprising two thermoelements, one said thermoelement consisting of P-type thermoelectric material and the other of N-type thermoelectric material, an electrical conductor for conductively joining said thermoelements to form a thermoelectric junction, at least one of said two thermoelements comprising an alloy consisting essentially of silicon and germanium, said alloy containing about 50 to 95 atomic percent silicon and including sufficient donor atoms to have a charge carrier concentration of from at least about $4\times10^{19}$ per cm.$^3$ to saturation.

3. A thermoelectric device comprising two thermoelements, one said thermoelement consisting of P-type thermoelectric material and the other of N-type thermoelectric material, an electrical conductor for conductively joining said thermoelements to form a thermoelectric junction, at least one of said two thermoelements comprising an alloy consisting essentially of silicon and germanium, said alloy containing about 50 to 95 atomic percent silicon and including sufficient acceptor atoms to have a charge carrier concentration of about $4\times10^{19}$ to $4\times10^{20}$ per cm.$^3$.

4. A thermoelectric device comprising two thermoelements, one said thermoelement consisting of P-type thermoelectric material and the other of N-type thermoelectric material, an electrical conductor for conductively joining said thermoelements to form a thermoelectric junction, at least one of said two thermoelements consisting of two different thermoelectric materials respectively adjacent the hot junction of said device and the cold junction of said device, the material adjacent said hot junction consisting essentially of an alloy of silicon and germanium, said alloy containing about 50 to 95 atomic percent silicon and having a charge carrier concentration of between about $4\times10^{19}$ to $4\times10^{20}$ per cm.$^3$.

5. A thermoelectric device comprising two thermoelements, one said thermoelement consisting of p-type thermoelectric material and the other of N-type thermoelectric material, an electrical conductor for conductively joining said thermoelements to form a thermoelectric junction, said P-type thermoelements comprising an alloy consisting essentially of silicon and germanium, said alloy containing about 50–95 atomic percent silicon and including sufficient boron atoms to have a charge carrier concentration of about $4\times10^{19}$ to $4\times^{20}$ cm.$^3$.

References Cited by the Examiner

UNITED STATES PATENTS

| | | | |
|---|---|---|---|
| 2,844,737 | 7/1958 | Hahn et al. | 252—62.3 |
| 2,953,529 | 9/1960 | Schultz | 252—62.3 |
| 3,061,657 | 10/1962 | Hockings | 136—5 |
| 3,186,873 | 6/1965 | Dunlap | 136—89 |

OTHER REFERENCES

Levitas: "Electrical Properties of Germanium-Silicon Alloys," in Physical Review, vol. 99, No. 6, pp. 1810–1814, 9/55.

WINSTON A. DOUGLAS, *Primary Examiner.*

A. B. CURTIS, *Assistant Examiner.*